US010884969B2

(12) United States Patent
Muljono et al.

(10) Patent No.: US 10,884,969 B2
(45) Date of Patent: Jan. 5, 2021

(54) ELASTIC EYE WIDENING CIRCUIT

(71) Applicant: Intel Corporation, Santa Clara, CA (US)

(72) Inventors: Harry Muljono, San Ramon, CA (US); Sanjay Joshi, Bangalore (IN); Charlie Changhong Lin, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 16/266,413

(22) Filed: Feb. 4, 2019

(65) Prior Publication Data

US 2020/0250124 A1  Aug. 6, 2020

(51) Int. Cl.
*G06F 13/42* (2006.01)
*G11C 7/22* (2006.01)
*G11C 7/10* (2006.01)

(52) U.S. Cl.
CPC ............ *G06F 13/4221* (2013.01); *G11C 7/10* (2013.01); *G11C 7/22* (2013.01); *G06F 2213/0026* (2013.01); *G06F 2213/0042* (2013.01)

(58) Field of Classification Search
CPC ......... G06F 13/4221; G06F 2213/0026; G06F 2213/0042; G11C 7/10; G11C 7/22
See application file for complete search history.

(56) References Cited

U.S. PATENT DOCUMENTS

| | | | | |
|---|---|---|---|---|
| 5,229,657 A | * | 7/1993 | Rackley | H03K 19/00346 326/26 |
| 5,903,543 A | * | 5/1999 | Lee | H04J 3/0688 370/216 |
| 2001/0014922 A1 | * | 8/2001 | Kuge | G06F 13/4239 710/36 |
| 2006/0182151 A1 | * | 8/2006 | Ramsdale | G06F 13/409 370/522 |
| 2007/0217559 A1 | * | 9/2007 | Stott | G11C 7/222 375/355 |

* cited by examiner

*Primary Examiner* — Henry Tsai
*Assistant Examiner* — John B Roche
(74) *Attorney, Agent, or Firm* — Schwegman Lundberg & Woessner, P.A.

(57) ABSTRACT

Some embodiments include an apparatus including a first node to receive an input data signal including a first edge, and a second edge occurring after the first edge; a second node to receive a strobe signal including an edge; a first circuit to generate a modified strobe signal based on the strobe signal, the modified strobe signal including an edge occurring after the edge of the strobe signal; a second circuit to generate a modified data signal based on the input data signal, the modified data signal including an edge occurring after the second edge of the input data signal; and a third circuit to respond to the modified strobe signal and generate an output data signal based on the modified data signal.

19 Claims, 5 Drawing Sheets

ELASTIC EYE WIDENING CIRCUIT

BACKGROUND

As speed in the operations of integrated circuit devices (e.g., memory devices and processors) increases to fulfill demand for increased input/output (I/O) bandwidth, many conventional techniques are designed to improve the quality of data signals in these devices. Such conventional techniques include continuous time linear equalization (CTLE), decision feedback equalizer (DFE), and receiver (RX) crosstalk cancellation. However, these conventional techniques may still face challenges in applications that require a relatively low data error rate and high data signal quality.

DETAILED DESCRIPTION

The techniques described herein relate to improving the data eye of data signals in an electronic device. The described techniques include a circuit block (e.g., an elastic eye widening circuit) that can operate to modify the timing of a data signal and a strobe signal (e.g., sampling clock signal) to stretch (e.g., widen) the data eye of the data signal in cycle-by-cycle basis. The modification can be based on timing of leading and trailing edges of the data signal with respect to the sampling edge of the strobe signal. The described techniques can improve a setup margin for the data signal by pushing out (e.g., delaying) the sampling edge of the strobe signal if the leading edge of the data signal arrives too close to the sampling edge of the strobe signal. The described techniques can also improve the hold margin for the data signal by pushing out (e.g., delaying) the trailing edge of data signal if the sampling edge of the strobe signal comes too close to the trailing edge of the data signal. The techniques described herein can improve a poor timing relationship between data and strobe signals that may be caused by intersymbol interference (ISI), crosstalk, deterministic jitter (Dj), random noise jitter (Rj), and other factors. Other technical effects of the techniques described herein will be apparent from various examples and figures described below.

Figure 1:
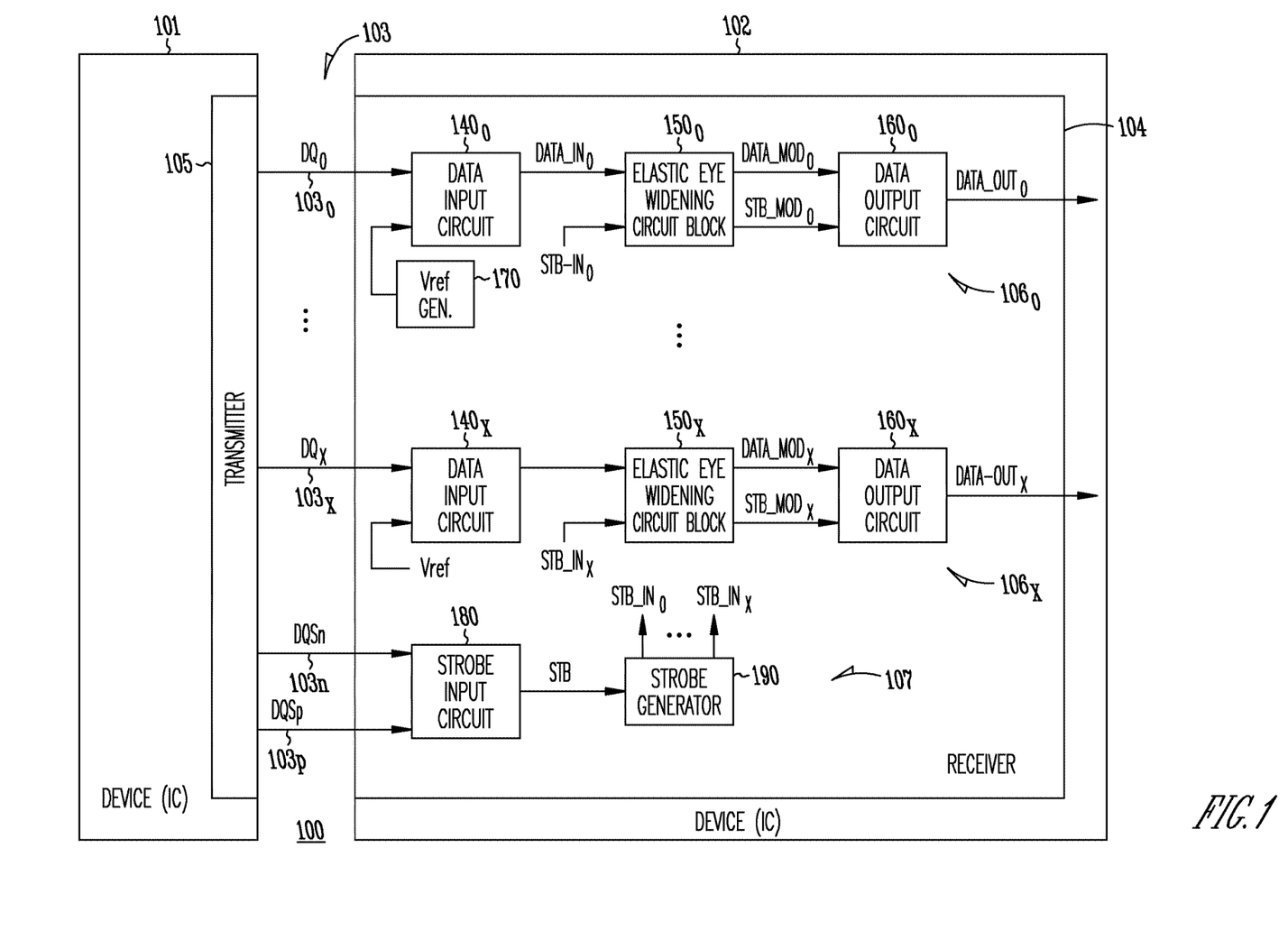
FIG. 1 shows an apparatus including a transmitter and a receiver, according to some embodiments described herein.

FIG. 1 shows an apparatus 100 including devices 101 and 102, and a channel 103 between devices 101 and 102, according to some embodiments described herein. Apparatus 100 can include or be included in an electronic device or system, such as a computer (e.g., server, desktop, laptop, or notebook), a tablet, a cellular phone, or other electronic devices or systems. Each of devices 101 and 102 can include an integrated circuit (IC), such as an IC chip. Devices 101 and 102 can include a combination of a controller (e.g., processors (e.g., central processing unit (CPU)), input/output controllers, or memory controller) and a memory device, or other electronic devices. FIG. 1 shows an example where device 101 can be a memory device and device 102 can be a controller.

Devices 101 and 102 can include a transmitter 105 and a receiver 104, respectively. Channel 103 can provide communication (e.g., in the form of signal transmission) between devices 101 and 102. Channel 103 can include lanes $103_0$ through $103_X$, $103n$ and $103p$ to conduct signals between devices 101 and 102. Each of lanes $103_0$ through $103_X$ can be used to carry a single-ended signal or alternatively a differential pair signal. Each of lanes $103_0$ through $103_X$ can include a single conductive trace (or alternatively multiple conductive traces), such as metal-based traces of a bus on a circuit board (e.g., printed circuit board of an electronic system) where devices 101 and 102 are located. In an alternative arrangement, channel 103 does not have to include conductive lines on a circuit board. For example, channel 103 can include a medium (e.g., air) for wireless communication between devices 101 and 102.

Devices 101 and 102 can communicate with each other by providing signals on lanes $103_0$ through $103_X$ and $103n$ and $103p$. As shown in FIG. 1, for example, transmitter 105 may transmit data signals $DQ_0$ through $DQ_X$ to receiver 104 on one portion of channel 103 (e.g., on lanes $103_0$ through $103_X$, respectively) and strobe signals DQSn and DQSp on another portion of channel 103 (e.g., on lanes $103n$ and $103p$, respectively).

As an example, device 101 can include a dynamic random-access memory (DRAM) device, such that each of data signals $DQ_0$ through $DQ_X$ can carry data information (e.g., data bits) transmitted from device 101 to device 102. In this example, strobe signals DQSn and DQSp can carry timing (e.g., clock) information associated with transmission of data signals $DQ_0$ through $DQ_X$. Strobe signals DQSn and DQSp can be a differential pair signal (e.g., strobe signals DQSn and DQSp can be a "true" and "complimentary" signal pair). FIG. 1 shows two strobe signals DQSn and DQSp as an example. The number of strobe signals can vary.

As shown in FIG. 1, receiver 104 can include circuit paths (e.g., read data paths) $106_0$ through $106_X$ to receive data signals $DQ_0$ through $DQ_X$, respectively, and a circuit path (e.g., read strobe path) 106 to receive strobe signals DQSn and DQSp. Circuit paths $106_0$ through $106_X$ can operate to generate data signals (e.g., output data signals) $DATA\_OUT_0$ through $DATA\_OUT_X$, respectively. Other circuits (not shown) of device 102 may receive data signals $DATA\_OUT_0$ through $DATA\_OUT_X$ for further processing.

Circuit path $106_0$ can include a data input circuit $140_0$, a circuit block (e.g., an elastic eye widening circuit block) $150_0$, a data output circuit $160_0$, and a reference voltage (Vref) generator 170 (which generates a reference voltage Vref). Data input circuit $140_0$ can receive data signal $DQ_0$ and reference voltage Vref and generate a data signal (e.g., input data signal) $DATA\_IN_0$. Circuit block $150_0$ can receive data signal $DATA\_IN_0$ and a strobe signal (e.g., input strobe signal) $STB\_IN_0$ to generate a modified data signal $DATA\_MOD_0$ and a modified strobe signal $STB\_MOD_0$. Data output circuit $160_0$ can receive modified data signal $DATA\_MOD_0$ and modified strobe signal $STB\_MOD_0$ to generate data signal (e.g., output data signal) $DATA\_OUT_0$.

Circuit path $106_X$ can include a data input circuit $140_X$, a circuit block (e.g., an elastic eye widening circuit block) $150_X$, and a data output circuit $160_X$. Data input circuit $140_X$ can receive data signal $DQ_X$ and reference voltage Vref and generate a data signal (e.g., input data signal) DATA_IN$_X$. Circuit block $150_X$ can receive data signal DATA_IN$_X$ and a strobe signal (e.g., input strobe signal) STB_IN$_X$ to generate a modified data signal DATA_MOD$_X$ and a modified strobe signal STB_MOD$_X$. Data output circuit $160_X$ can receive modified data signal DATA_MOD$_X$ and modified strobe signal STB_MOD$_X$ to generate data signal (e.g., output data signal) DATA_OUT$_X$.

Circuit path 107 can include a strobe input circuit 180 to receive strobe signals DQSn and DQSp to generate a strobe signal STB, and a strobe generator 190 to generate strobe signals (e.g., input strobe signals) STB_IN$_0$ through STB_IN$_X$. Strobe generator 190 can include a delay circuit (e.g., a delay line) and phase interpolation circuitry to generate strobe signals STB_IN$_0$ through STB_IN$_X$ based on strobe signal STB. Receiver 104 can include components and operations of the circuits described below with reference to FIG. 2 through FIG. 6. For example, each of circuit blocks $150_0$ and $150_X$ and each of data output circuits $160_0$ and $160_X$ can include circuit block 550 and circuit 560, respectively, of FIG. 5, as described below with reference to FIG. 2 through FIG. 6.

Figure 2:
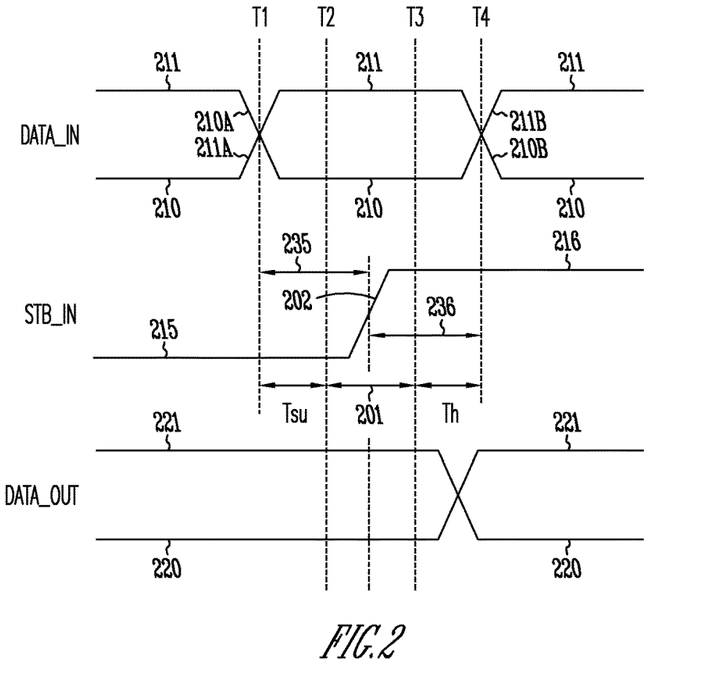
FIG. 2 is an example timing diagram of a data signal, a strobe signal, and an output data signal, showing an example of a good timing relationship between data and strobe signals, according to some embodiments described herein.

FIG. 2 is an example timing diagram of a data signal DATA_IN, a strobe signal STB_IN and an output data signal DATA_OUT, showing an example of a good timing relationship between data and strobe signals, according to some embodiments described herein. Data signal (e.g., input data signal) DATA_IN can be one of data signals DATA_IN$_0$ through DATA_IN$_X$ of FIG. 1. Strobe signal (e.g., input strobe signal) STB_IN can be one of strobe signals STB_IN$_0$ through STB_IN$_X$ of FIG. 1. STB_IN can be used as a timing signal to capture (e.g., sample) information (e.g., bits of information) carried by DATA_IN. Data signal DATA_OUT can be one of data signals DATA_OUT$_0$ through DATA_OUT$_X$ of FIG. 1.

FIG. 2 shows different times (e.g., points in time) T1, T2, T3, and T4. The time interval between times T1 and T4 can be a cycle of data signal DATA_IN at which information (e.g., a bit of data) can be carried by data signal DATA_IN during the cycle. FIG. 2 shows only one cycle (between times T1 and T4) of data signal DATA_IN as an example. However, data signal DATA_IN can have many cycles at which many bits of data can be carried during respective cycles of data signal DATA_IN. The value of information (e.g., the value of a bit of data) during a particular cycle of data signal DATA_IN can be based on the level (e.g., voltage level) of data signal DATA_IN during that particular cycle.

As shown in FIG. 2, data signal DATA_IN can have either level (e.g., voltage level) 210 or level (e.g., voltage level) 211. Levels 210 and 211 can represent different values (e.g., binary values) of information (e.g., a bit of information) carried by data signal DATA_IN. For example, level 210 can represent information having binary value zero (e.g., "0"), and level 211 can represent information having a binary value one "1".

Data signal DATA_IN can have a leading edge and a trailing edge during one cycle of data signal DATA_IN. As shown in FIG. 2, data signal DATA_IN can have either a leading edge 210A or a leading edge 211A when data signal DATA_IN changes (e.g., makes a transition) from one level to another level at the beginning of a cycle (e.g., at time T1) of data signal DATA_IN. For example, data signal DATA_IN can have leading edge 210A when data signal DATA_IN changes from a higher level (e.g., level 211) to a lower level (e.g., level 210). In another example, data signal DATA_IN can have leading edge 211A when data signal DATA_IN changes from a lower level (e.g., level 210) to a higher level (e.g., level 211).

Data signal DATA_IN can have either a trailing edge 210B or a trailing edge 211B when data signal DATA_IN changes (e.g., makes a transition) from one level to another level at the end of a cycle (e.g., at time T4) data signal DATA_IN. For example, data signal DATA_IN can have trailing edge 210B when data signal DATA_IN changes from a higher level (e.g., level 211) to a lower level (e.g., level 210). In another example, data signal DATA_IN can have trailing edge 211B when data signal DATA_IN changes from a lower level (e.g., level 210) to a higher level (e.g., level 211).

Strobe signal STB_IN can have an edge (e.g., sampling edge) 202, which can be used as a timing (e.g., a point in time) to capture (e.g., to sample) the information (e.g., a bit of data) carried during a cycle of data signal DATA_IN. Edge 202 can occur when strobe signal STB_IN changes (e.g., makes a transition) from one level to another level during a cycle of data signal DATA_IN. For example, strobe signal STB_IN can have edge 202 when strobe signal STB_IN changes from a lower level (e.g., level 215) to a higher level (e.g., level 216) between times T2 and T3.

Data signal DATA_OUT can have either level (e.g., voltage level) 220 or level (e.g., voltage level) 221. Levels 220 and 221 can represent information having values "0" and "1", respectively. Levels 220 and 221 can be the same as levels 210 and 211, respectively. The value (e.g., "0" or "1") of data signal DATA_OUT after time T4 can represent the value of information carried during a particular portion of a cycle of data signal DATA_IN. For example, if data signal DATA_IN has level 210 (e.g., representing "0") during a time interval 201, then data signal DATA_OUT can have level 220 (e.g., representing "0") after time T4. In another example, if data signal DATA_IN has level 211 (e.g., representing "1") during time interval 201, then data signal DATA_OUT can have level 221 (e.g., representing "1") after time T4.

Time interval 201 (which is between times T2 and T3) in FIG. 2 can be selected (e.g., predetermined by designed) to be large enough (e.g., to be sufficient) so that the information carried during a cycle of data signal DATA_IN can be correctly (e.g., accurately) captured based on timing of (e.g., edge 202) of strobe signal STB_IN. As shown in FIG. 2, time interval 201 can be between (e.g., can occur between) a setup margin (e.g., minimum setup margin) Tsu and a hold margin (e.g., minimum hold margin) Th within a cycle of data signal DATA_IN.

Setup margin Tsu can be a time interval between times T1 and T2. Hold margin can be a time interval between times T3 and T4. Each of setup margin Tsu and hold margin Th can be selected (e.g., predetermined) to be large enough, so that the information carried during a cycle of data signal DATA_IN can be correctly captured based on timing (e.g., an edge) of strobe signal STB_IN.

FIG. 2 shows an example of a good timing relationship between data signal DATA_IN and strobe signal STB_IN where setup margin Tsu and hold margin Th are relatively large enough, such that the leading edge (e.g., leading edge 210A or 211A) of data signal DATA_IN is not too close to the sampling edge (e.g., edge 202) of strobe signal STB_IN, and such that the sampling edge of strobe signal STB_IN is not too close to the trailing edge (e.g., trailing edge 210B or 211B) of data signal DATA_IN. This can allow a time interval 235 (between the leading edge of data signal DATA_IN and the edge of strobe signal STB_IN) to be relatively large, and a time interval 236 (between the edge of strobe signal STB_IN and the trailing edge of data signal DATA_IN) to be relatively large. The large value of each of time intervals 235 and 236 helps safely and correctly capturing the information carried by a cycle of data signal DATA_IN.

In FIG. 2, the data eye of data signal DATA_IN can be based on measurements of many samples (e.g., bits) of information carried by many cycles of data signal DATA_IN. A relatively wider data eye (e.g., the bigger the opening of data signal DATA_IN bounded by the levels of data signal DATA_IN between leading and trailing edges at times T1 and T4, respectively, where times T1 and T4 are not necessary from consecutive bits) can result in a lower error rate of the sampling (e.g., capturing) of information carried by data signal DATA_IN.

In some situations, during an operation of the device or devices (e.g., device 101, 102, or both) on data signal DATA_IN, setup margin Tsu and hold margin Th can be relatively small. This can result in a poor timing relationship between data signal DATA_IN and strobe signal STB_IN. In such situations, the information carried during a particular cycle of data signal DATA_IN may be incorrectly captured (e.g., sampled) or may fail to be captured.

Figure 3:
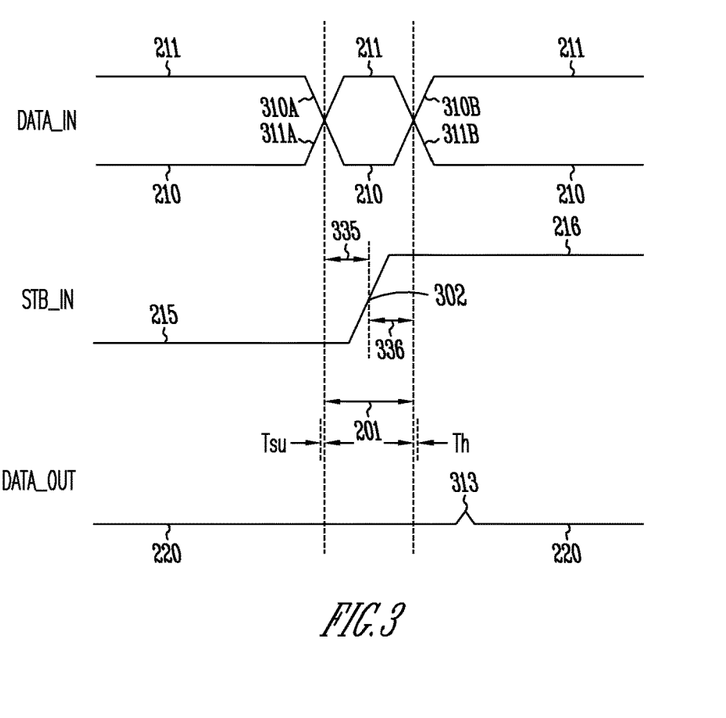
FIG. 3 is another example timing diagram of an input data signal, a strobe signal, and an output data signal, showing an example of a poor timing relationship between data and strobe signals, according to some embodiments described herein.

FIG. 3 is another example timing diagram of an input data signal, a strobe signal, and an output data signal, showing an example of a poor timing relationship between data signal DATA_IN and strobe signal STB_IN, according to some embodiments described herein. Signals data signal DATA_IN, strobe signal STB_IN, and data signal DATA_OUT can be similar to those of FIG. 2. However, FIG. 3 shows an example of a poor timing relationship between data signal DATA_IN and strobe signal STB_IN, such that each of setup margin Tsu and hold margin Th is relatively small (e.g., zero or near zero, as shown in FIG. 3) in comparison to setup margin Tsu and hold margin Th, respectively, of the example of FIG. 2. The small setup margin Tsu and hold margin Th in FIG. 3 can reduce the accuracy in capturing the information carried by data signal DATA_IN. This can lead to inaccurate (e.g., invalid) information represented by data signal DATA_OUT. FIG. 3 shows a level 313 (which is neither level 220 or level 221) to indicate an inaccurate (or invalid) capturing of data signal DATA_IN. Inaccurate or invalid information leads to a higher data error rate.

As shown in FIG. 3, data signal DATA_IN can have levels 210 and 211, leading edges 310A and 311A, and trailing edges 310B and 311B. Strobe signal STB_IN can have levels 215 and 216, and an edge (e.g., sampling edge) 302. Time interval 335 can be the time interval between the leading edge (either leading edge 310A or 311A) of data signal DATA_IN and edge 302 of strobe signal STB_IN. Time interval 336 can be the time interval between edge 302 of strobe signal STB_IN and the trailing edge (either trailing edge 310B or 311B) of data signal DATA_IN.

Comparing the timing relationships of the signals in FIG. 2 with those of FIG. 3, time interval 335 in FIG. 3 is less than (e.g., shorter than) time interval 235 of FIG. 2 (e.g., because setup margin Tsu of FIG. 3 is less than setup margin Tsu of FIG. 2). The relatively shorter time interval 335 of FIG. 3 can indicate that the leading edge (either leading edge 310A or 311A) of data signal DATA_IN in FIG. 3 is too close to edge 302 of strobe signal STB_IN in FIG. 3.

Time interval 336 in FIG. 3 is also less than (e.g., shorter than) time interval 236 of FIG. 2 (e.g., because hold margin Th of FIG. 3 is less than hold margin Th of FIG. 2). The relatively shorter time interval 336 of FIG. 3 can indicate that edge 302 of strobe signal STB_IN in FIG. 3 is too close to trailing edge (either trailing edge 310B or 311B) of data signal DATA_IN in FIG. 3. Either a relatively short (e.g., too small) time interval 335 or a relatively short (e.g., too small) time interval 336 can result in incorrect sampling of information carried by data signal DATA_IN.

As discussed in more detail below, the techniques described herein can improve (e.g., widen) the data eye of a data signal (e.g., data signal DATA_IN) with respect to a strobe signal (e.g., sampling clock signal). For example, the techniques described can modify the timing relationship between the leading edge of the data signal and the sampling edge of a strobe signal (e.g., strobe signal STB_IN) in order to improve (e.g., increase) the value (in time unit) of setup margin Tsu. In another example, the techniques described can also modify the timing relationship between the sampling edge of the strobe signal (e.g., strobe signal STB_IN) in order to improve (e.g., increase) the value (in time unit) of hold margin Th. The techniques described herein can allow the device or the system that employs the techniques described herein to have a relatively lower data error rate.

Figure 4:
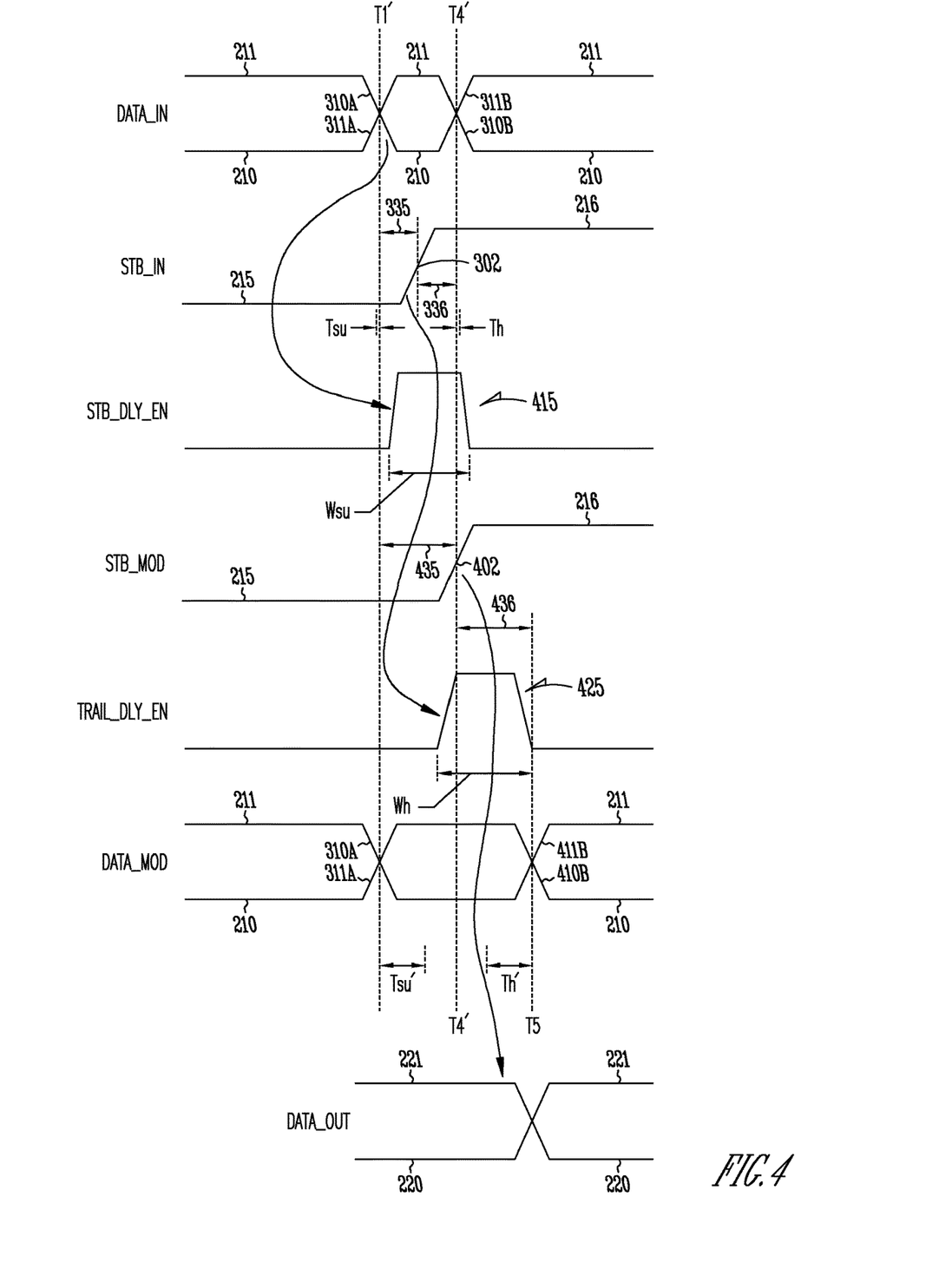
FIG. 4 is an example timing diagram of a data signal, a strobe signal, a modified strobe signal, and a modified data signal, according to some embodiments described herein.

FIG. 4 is an example timing diagram of an input data signal, a strobe signal, a modified strobe signal, and a modified data signal, according to some embodiments described herein. For simplicity, the example of FIG. 4 uses the same data signal DATA_IN and strobe signal STB_IN as the example of FIG. 3. As shown in FIG. 4, each of setup margin Tsu and hold margin Th can be relatively small (e.g., close to zero, as discussed above with reference to FIG. 3). The techniques described in the example of FIG. 4 include improving (e.g., increasing) setup margin Tsu and hold margin Th to obtain setup margin (e.g., modified setup margin) Tsu' and hold margin (e.g., modified hold margin) Th', respectively. The modified setup and hold margin can improve (e.g., widen) the data eye of data signal DATA_IN, thereby achieving improvements and benefits (e.g., correct sampling and lower data error rate) mentioned above.

As shown in FIG. 4, the leading edge (e.g., leading edge 310A or 311A) of data signal DATA_IN can be used to generate a signal (e.g., strobe delay enable signal) STB_DLY_EN. Then, signal STB_DLY_EN can be used to modify (e.g., delay) edge 302 of strobe signal STB_IN if the leading edge of data signal DATA_IN is too close to the sampling edge (e.g., edge 302) of strobe signal STB_IN. This improves (e.g., increase) the setup margin for data signal DATA_IN. For example, as shown in FIG. 4, the value (in time unit) of setup margin Tsu can be modified (e.g., increased) to a greater value, which is the value (in time unit) of setup margin (e.g., modified setup margin) Tsu'.

Signal STB_DLY_EN can include a pulse 415. Pulse 415 can have a pulse width Wsu. The value (in time unit) of pulse width Wsu can be selected (e.g., predetermined), such that setup margin Tsu can be modified to setup margin Tsu' if the leading edge (e.g., leading edge 310A or 311A) of data signal DATA_IN is too close to the sampling edge (e.g., edge 302) of strobe signal STB_IN (e.g., if setup margin Tsu is relatively small, such that a time interval between leading edge 310A or 311A of data signal DATA_IN and edge 302 of strobe signal STB_IN is less than the value of pulse width Wsu).

As shown in FIG. 4, a strobe signal (e.g., modified strobe signal) STB_MOD can be generated. Strobe signal STB_MOD can be a modified (e.g., delayed) version of strobe signal STB_IN where the sampling edge of strobe signal STB_MOD can be based on signal STB_DLY_EN.

Signal STB_MOD can include an edge (e.g., sampling edge) 402. Time interval 435 can be the time interval between the leading edge (either leading edge 310A or 311A) of data signal DATA_IN and edge 402 of strobe signal STB_MOD. Signal STB_DLY_EN (generated based on the leading edge of data signal DATA_IN) can be used to control the timing of strobe signal STB_MOD, such that edge 402 of strobe signal STB_MOD can occur after the occurrence of edge 302 of strobe signal STB_IN based on signal STB_D-LY_EN. As shown in FIG. 4, since edge 402 of strobe signal STB_MOD can occur after the occurrence of edge 302 of strobe signal STB_IN, time interval 435 can be greater than time interval 335. The difference (in time unit) between time intervals 435 and 335 can be based on the value of pulse width Wsu of signal STB_DLY_EN.

As shown in FIG. 4, edge 302 of strobe signal STB_IN can be used to generate a signal (e.g., trailing edge delay enable signal) TRAIL_DLY_EN. Then, signal TRAIL_D-LY_EN can be used to modify (e.g., delay) the trailing edge (e.g., trailing edge 310B or 311B) of data signal DATA_IN if the sampling edge (e.g., edge 302) of strobe signal STB_IN is too close to the trailing edge of data signal DATA_IN. This improves (e.g., increases) the hold margin of data signal DATA_IN. For example, as shown in FIG. 4, the value (in time unit) of hold margin Th can be modified (e.g., increased) to a greater value, which is the value (in time unit) of hold margin (e.g., modified setup margin) Th'.

Signal TRAIL_DLY_EN can include a pulse 425. Pulse 425 can have a pulse width Wh. The value (in time unit) of pulse width Wh can be selected (e.g., predetermined), such that hold margin Th can be modified to hold margin Th' if the sampling edge (e.g., edge 302) of strobe signal STB_IN is too close to the trailing edge (e.g., trailing edge 310B or 311B) of data signal DATA_IN (e.g., if hold margin Th is relatively small, such that a time interval between edge 302 of strobe signal STB_IN and trailing edge 310B or 311B of data signal DATA_IN and is less than the value of pulse width Wh).

As shown in FIG. 4, a data signal DATA_MOD can be generated. Data signal DATA_MOD can include a trailing edge that can be a modified (e.g., delayed) trailing edge of data signal DATA_IN. Data signal DATA_MOD can include a leading edge (e.g., leading edge 310A or 311A) that can be based on (e.g., can be the same as) the leading edge of data signal DATA_IN. Data signal DATA_MOD can include a trailing edge (e.g., trailing edge 410B or 411B) that can occur (e.g., at approximately time T5) after the occurrence of the trailing edge (e.g., trailing edge 310B or 311B) of data signal DATA_IN. In FIG. 4, time interval 436 can be the time interval between edge 402 of strobe signal STB_MOD and the trailing edge (either trailing edge 410B or 411B) of data signal DATA_MOD. Signal TRAIL_DLY_EN (generated based on edge 302 of strobe signal STB_IN) can be used to control the timing of the trailing edge (e.g., trailing edge 310B or 311B) of data signal DATA_IN, such that trailing edge 410B or 411B of data signal DATA_MOD can occur after the occurrence of trailing edge 310B or 311B of data signal DATA_IN based on signal TRAIL_DLY_EN. As shown in FIG. 4, since trailing edge 410B or 411B of data signal DATA_MOD can occur after the occurrence of trailing edge 310B or 311B of data signal DATA_IN, time interval 436 can be greater than time interval 336. The difference (in time unit) between time intervals 436 and 336 can be based on the value of pulse width Wh of signal TRAIL_DLY_EN.

As described above with reference to FIG. 3, incorrect (or invalid) sampling of information carried by data signal DATA_IN can occur if setup margin Tsu, hold margin Th, or both is relatively small. For example, data signal DATA_OUT in FIG. 3 can be incorrect (e.g., signal DATA_OUT has level 313). However, with the techniques described above with reference to FIG. 4, data signal DATA_OUT in FIG. 4 can have level 220 or 221 after time T5. This can indicate that the information carried by data signal DATA_IN between times T1' and T4' is correctly captured (e.g., sampled).

Figure 5:
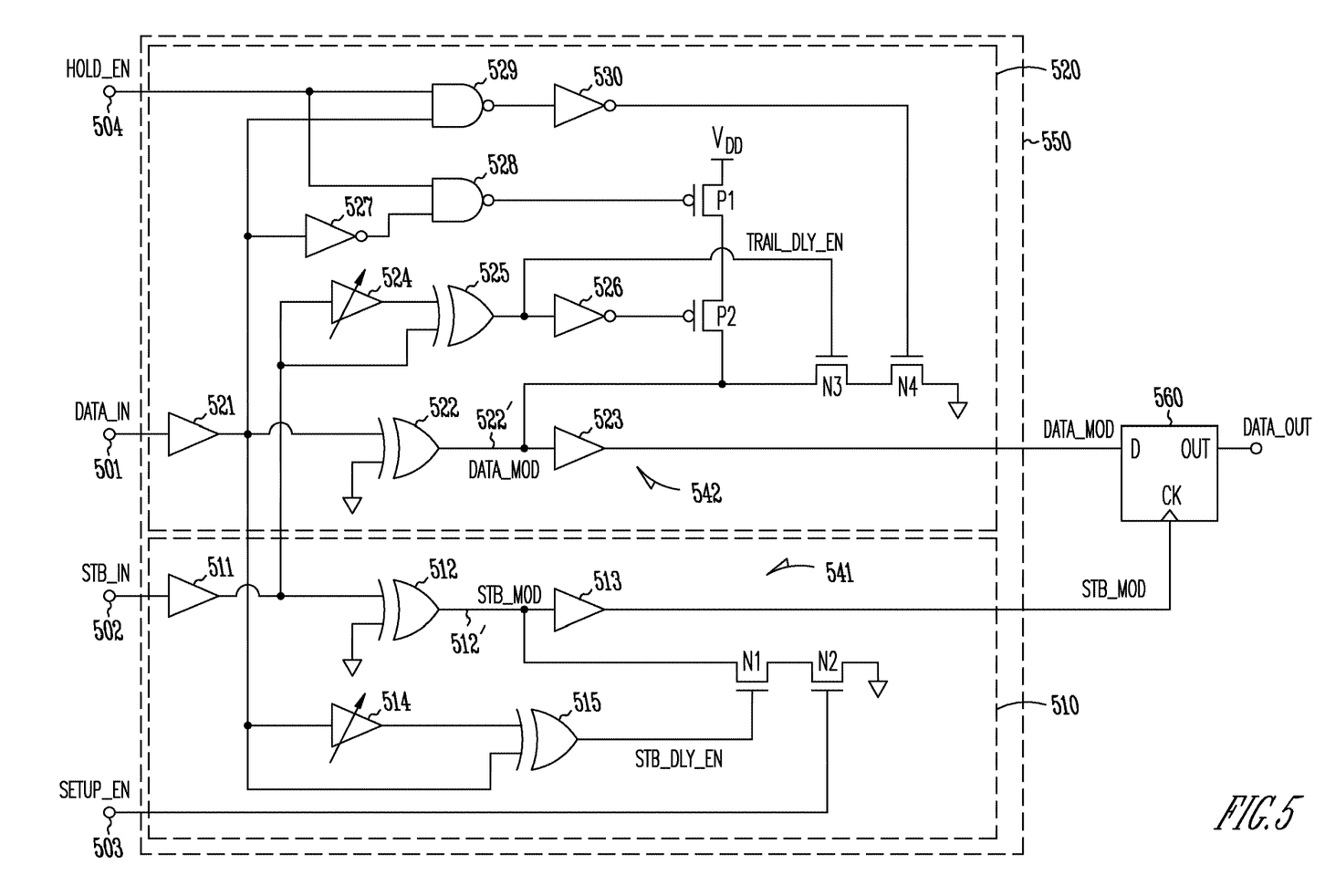
FIG. 5 shows an elastic eye widening circuit block and a data output circuit, according to some embodiments described herein.

FIG. 5 shows circuit block 550 and circuit 560, according to some embodiments described herein. Circuit block (e.g., elastic eye widening circuit block) 550 can be included as one of circuit blocks $150_0$ and $150_X$ of FIG. 1. Circuit block 550 can operate to improve the timing relationship between data and strobe signals to generate modified data and strobe signals, such as the modified data signal (e.g., data signal DATA_MOD) and modified strobe signal (e.g., data signal STB_MOD) described above with reference to FIG. 4.

As shown in FIG. 5, circuit block 550 can include circuits 510 and 520 coupled to a node (e.g., data input node) 501 and a node (e.g., strobe input node) 502. Node 501 can receive data signal DATA_IN. Node 502 can receive strobe signal STB_IN. Data signal DATA_IN can correspond to one of data signals $DATA\_IN_0$ through $DATA\_IN_X$ of FIG. 1. Strobe signal STB_IN can correspond to one of strobe signals $STB\_IN_0$ through $STB\_IN_X$ of FIG. 1. In FIG. 5, data signal DATA_IN and strobe signal STB_IN can have a timing relationship similar to that of data signal DATA_IN and strobe signal STB_IN described above with reference to FIG. 2 through FIG. 4.

Circuit 510 in FIG. 5 can be called a setup fixing circuit, which can operate to improve (e.g., increase) the setup margin (e.g., setup margin Tsu) of data signal DATA_IN of FIG. 5 if a leading edge of data signal DATA_IN is too close to the sampling edge of strobe signal STB_IN. Circuit 520 can be called a hold fixing circuit, which can operate to improve (e.g., increase) the hold margin (e.g., hold margin Th) of data signal DATA_IN of FIG. 5 if the sampling edge of strobe signal STB_IN is too close to the trailing edge of data signal DATA_IN.

As shown in FIG. 5, circuit 510 can include a circuit path 541 that includes a driver (e.g., input buffer) 511, a logic gate (e.g., exclusive OR gate) 512, and a driver (e.g., output buffer) 513. Circuit path 541 can operate to generate strobe signal STB_MOD based on strobe signal STB_IN and the timing of signal STB_DLY_EN. Circuit 510 can include a delay line 514 and a logic gate (e.g., exclusive OR gate) 515 that can operate to generate signal STB_DLY_EN based on the leading edge of data signal DATA_IN (e.g., leading edge 310A or 311A shown in FIG. 4). Circuit 510 can include transistors N1 and N2 coupled in series between an output node 512' of logic gate 512 and a ground connection. Signal STB_DLY_EN can be used to control the gate of transistor N1.

Circuit 520 can include a circuit path 542 that includes a driver (e.g., input buffer) 521, a logic gate (e.g., exclusive OR gate) 522, and a driver (e.g., output buffer) 523. Circuit path 542 can operate to generate data signal DATA_MOD based on data signal DATA_IN and the timing of signal TRAIL_DLY_EN. Circuit 520 can include a delay line 524 and a logic gate (e.g., exclusive OR gate) 525 that can operate to generate signal TRAIL_DLY_EN based on the edge of strobe signal STB_IN (e.g., edge 302 shown in FIG. 4). Circuit 520 can include transistors N3 and N4 coupled in series between an output node 522' of logic gate 522 and the ground connection. Signal TRAIL_DLY_EN can be used to control the gate of transistor N3. Circuit 520 can also include inverter 526, inverter 527, a logic gate (e.g., NAND gate) 528, a logic gate (e.g., NAND gate) 529, and an inverter 530. Voltage VDD can be a supply voltage of circuit block 550 (e.g., a supply voltage of a receiver (e.g., receiver 104 of FIG. 1) that includes circuit block 550.

In FIG. 5, circuit 560 (e.g., data output circuit) can be included as each of circuit blocks 150$_0$ and 150$_X$ of FIG. 1. As shown in FIG. 5, circuit block 550 can provide data signal DATA_MOD and strobe signal STB_MOD to circuit 560. Circuit 560 can include a sampler (e.g., data sampler, or a flip-flop) to sample data signal DATA_MOD based on timing (e.g., a sampling edge) of strobe signal STB_MOD.

Circuit 560 can include a data input node D coupled to the output node of driver 523 to receive signal DATA_MOD, a data output node OUT to provide data signal DATA_OUT, and a clock input node CK coupled to the output node of driver 513 to receive strobe signal STB_MOD. Data signal DATA_OUT can be one of data signals DATA_OUT$_0$ through DATA_OUT$_X$ of FIG. 1.

As shown in FIG. 5, circuit paths 541 and 542 can have the same number of circuit elements and matching circuit elements. For example, circuit path 541 can have three circuits elements (drivers 511 and 513, and logic gate 512) and circuit path 542 can also have three circuit elements (drivers 521 and 523, and logic gate 522). Having the same and matching number of circuit elements between circuit paths 541 and 542 can improve accuracy of data signals DATA_MOD and STB_MOD provided to circuit 560.

Each of delay lines 514 and 524 can include a variable (e.g., tunable (e.g., programmable)) delay line. Delay line 514 can be tuned (e.g., programmed) through either fuses or control registers to select an amount of time that the leading edge of data signal DATA_IN can be delayed by delay line 514. Delay line 524 can be tuned (e.g., programmed) through either fuse or control register to select an amount of time that a sampling edge of strobe signal STB_IN can be delayed by delay line 524.

Circuit 510 can be trained (e.g., by using a one-time basic input output system (BIOS) training) to select the amount of time delay provided by each of delay lines 514 and 524. As an example, delay line 514 can be selected (e.g., programmed) such that the value (in time unit) of the pulse width (e.g., pulse width Wsu in FIG. 4) of signal STB_DLY_EN (FIG. 5) can be based on (e.g., equal to) the amount of time delay provided by delay line 514. In another example, delay line 524 can be selected (e.g., programmed) such that the value (in time unit) of the pulse width (e.g., pulse width Wh in FIG. 4) of signal TRAIL_DLY_EN (FIG. 5) can be based on (e.g., equal to) the amount of time delay provided by delay line 524. Such a training (e.g., to select the time delay provided by each of delay lines 514 and 524) can be performed to widen the data eye of data signal DATA_IN and ensure that the sampling edge of strobe signal STB_IN can be appropriately delayed (e.g., delayed only as needed) during a particular cycle of data signal DATA_IN. This can prevent the delay lines 514 and 524 from impacting latency and consuming the timing margin of the next cycle of data signal DATA_IN.

Circuit block 550 can operate to modify the timing relationship between data signal DATA_IN and strobe signal STB_IN, such that signals STB_DLY_EN, TRAIL_DLY_EN, STB_MOD, DATA_MOD, and DATA_OUT can have timing relationships similar to those shown in FIG. 4. For example, if the timing relationship between data signal DATA_IN and strobe signal STB_IN in a particular cycle results in setup margin, hold margin, or both for data signal DATA_IN being relatively small, then circuit block 550 can operate to improve the timing relationship between data signal DATA_IN and strobe signal STB_IN.

In operation, circuit 510 can use signal STB_DLY_EN (generated based on the leading edge of data signal DATA_IN) to delay the sampling edge of strobe signal STB_IN for an amount of time (e.g., predetermined amount of time) if a time interval (e.g., time interval corresponding to setup margin Tsu in FIG. 4) between the leading edge (e.g., leading edge 310A or 311A in FIG. 4) of data signal DATA_IN and the sampling edge (e.g., edge 302 in FIG. 4) of strobe signal STB_IN is less than such an amount of time. The amount of time (to delay the sampling edge of strobe signal STB_IN) discussed here can be a selected (e.g., programmable) amount of time (e.g., a time interval corresponding to setup margin Tsu in FIG. 2) large enough for data signal DATA_IN to be correctly sampled. The amount of time can be based on (e.g., equal to) a time delay provided by (e.g., programmed in) delay line 514.

In operation, circuit 520 can use signal TRAIL_DLY_EN (generated based on the sampling edge of strobe signal STB_IN) to delay the trailing edge of data signal DATA_IN for an amount of time (e.g., predetermined amount of time) if a time interval (e.g., time interval corresponding to setup margin Th in FIG. 4) between sampling edge (e.g., edge 302 in FIG. 4) of strobe signal STB_IN and the trailing edge (e.g., trailing edge 310B or 311B in FIG. 4) of data signal DATA_IN is less than such an amount of time. The amount of time (to delay the trailing edge of data signal DATA_IN) discussed here can be a selected (e.g., programmable) amount of time (e.g., a time interval corresponding to hold margin Th in FIG. 2) large enough for data signal DATA_IN to be correctly sampled. The amount of time can be based on (e.g., equal to) a time delay provided by (e.g., programmed in) delay line 514.

As shown in FIG. 5, circuit block 550 can also receive a signal (e.g., setup enable signal) SETUP_EN at a node 503, and a signal (e.g., hold enable signal) HOLD_EN at a node 504. Signals SETUP_EN and HOLD_EN can be activated (e.g., automatically activated) or deactivated (e.g., automatically activated) by a device or system that includes circuit block 550. Signal SETUP_EN can be activated by causing it to have one level (e.g., "1") and deactivated by causing it to have another level (e.g., "0"). Similarly, signal HOLD_EN can be activated by causing it to have one level (e.g., "1") and deactivated by causing it to have another level (e.g., "0").

The description above with reference to FIG. 5 shows example situations when both signals SETUP_EN and HOLD_EN are activated to allow generation of signal STB_DLY_EN and signal TRAIL_DLY_EN having timing as shown in the example of FIG. 4. The activation of both signals SETUP_EN and HOLD_EN causes the sampling edge (e.g., edge 303) of strobe signal STB_IN to be modified (e.g., to become edge 403) and the trailing edge (e.g., trailing edge 310B or 311B) to be modified (e.g., to become trailing edge 410B or 411B). However, signal SETUP_EN, signal HOLD_EN, or both in FIG. 5 can be deactivated.

For example, in a situation where the sampling edge of strobe signal STB_IN in FIG. 5 may not be needed to be modified, signal SETUP_EN can be deactivated. In this example, the circuit portion (e.g., the circuit elements of circuit 510 in FIG. 5 except drivers 511 and 513 and logic gate 512) associated with the generation of signal STB_DLY_EN can be disabled (e.g., by passed), thereby disabling the generation of signal STB_DLY_EN. In this example, the timing of strobe signal STB_MOD can be the same as the timing of strobe signal STB_IN (assuming the time delay of logic gate 512 is negligible).

In another example, in a situation where the trailing edge of data signal DATA_IN in FIG. 5 may not be needed to be modified, signal HOLD_EN can be deactivated. In this example, the circuit portion (e.g., the circuit elements of circuit 520 in FIG. 5 except drivers 521 and 532 and logic gate 522) associated with the generation of signal TRAIL_DLY_EN can be disabled (e.g., bypassed), thereby disabling the generation of signal TRAIL_DLY_EN. In this example, the timing of DATA_MOD can be the same as the timing of data signal DATA_IN (assuming the time delay of logic gate 522 is negligible).

In a further example, in a situation where the sampling edge of strobe signal STB_IN and the trailing edge of data signal DATA_IN in FIG. 5 may not be needed to be modified, signals SETUP_EN and HOLD_EN can be deactivated. In this example, the circuit portions associated with the generation of signals STB_DLY_EN and TRAIL_D-LY_EN can be disabled (e.g., bypassed), thereby disabling the generation of signals STB_DLY_EN and TRAIL_D-LY_EN. In this example, the timing of strobe signal STB_MOD can be the same as the timing of strobe signal STB_IN (assuming the time delay of logic gate 512 is negligible), and the timing of DATA_MOD can be the same as the timing of data signal DATA_IN (assuming the time delay of logic gate 522 is negligible).

Figure 6:
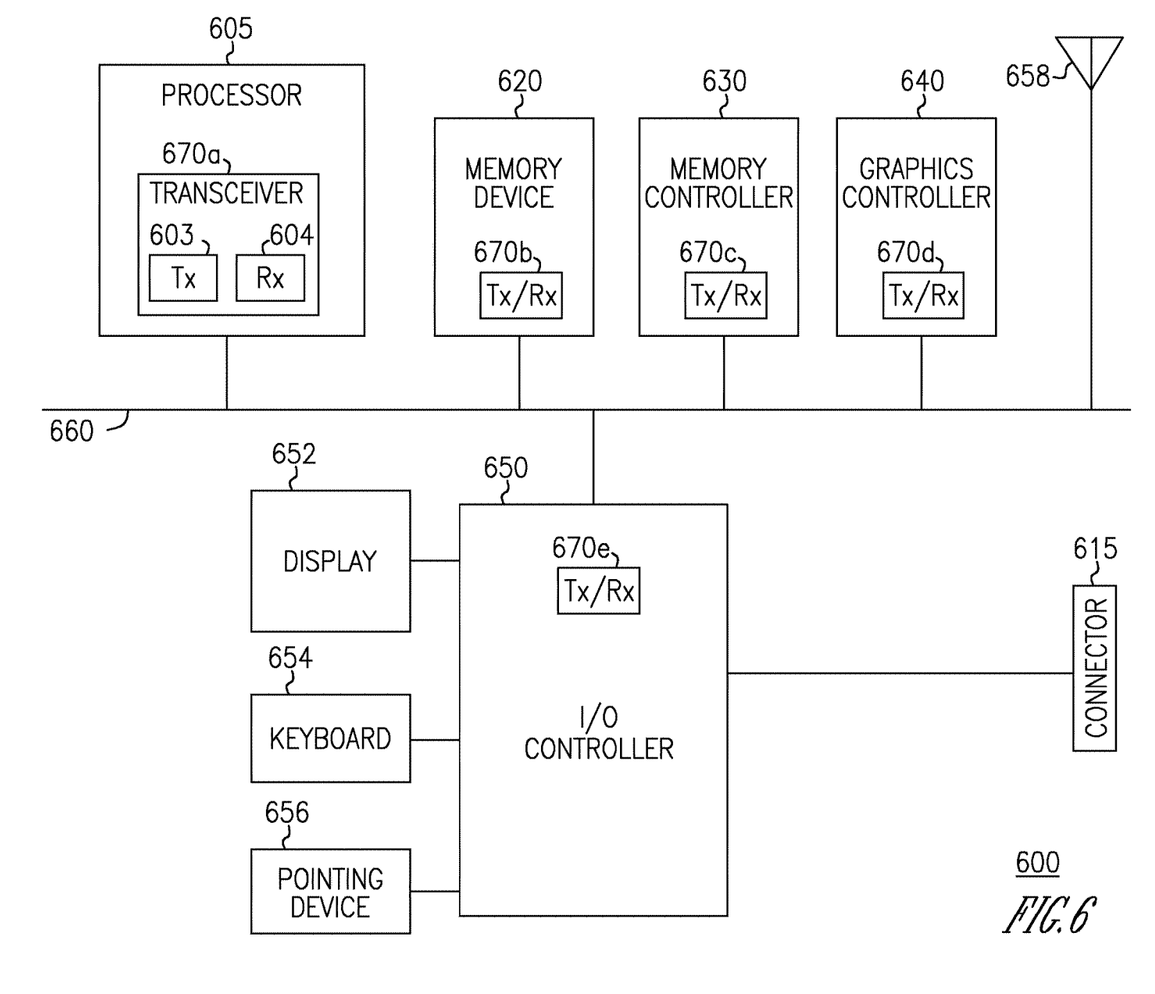
FIG. 6 shows a system, according to some embodiments described herein.

FIG. 6 shows an apparatus in the form of a system (e.g., electronic system) 600, according to some embodiments described herein. System 600 can include or be included in a computer, a tablet, or other electronic systems. As shown in FIG. 6, system 600 can include components, such as a processor 605, a memory device 620, a memory controller 630, a graphics controller 640, an input and output (I/O) controller 650, a display 652, a keyboard 654, a pointing device 656, at least one antenna 658, a connector 615, and a bus 660. Bus 660 can include conductive lines (e.g., metal-based traces on a circuit board where the components of system 600 are located).

In some arrangements, system 600 does not have to include a display. Thus, display 652 can be omitted from system 600. In some arrangements, system 600 does not have to include any antenna 658. Thus, antenna 658 can be omitted from system 600.

Processor 605 can include a general-purpose processor or an application-specific integrated circuit (ASIC). Processor 605 can include a central processing unit (CPU).

Memory device 620 can include a DRAM device, a static random-access memory (SRAM) device, a flash memory device, phase change memory, a combination of these memory devices, or other types of memory. FIG. 6 shows an example where memory device 620 is a stand-alone memory device separated from processor 605. In an alternative arrangement, memory device 620 and processor 605 can be located on the same die. In such an alternative arrangement, memory device 620 is an embedded memory in processor 605, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antenna 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615.

Connector 615 and at least a portion of bus 660 can include conductive lines that conform with at least one of USB, DP, HDMI, Thunderbolt, PCIe, Ethernet, and other specifications.

As shown in FIG. 6, processor 605 can include a transceiver (Tx/Rx) 670a having a transmitter (Tx) 603 and a receiver (Rx) 604. Transmitter 603 can operate to transmit information from processor 605 to another part of system 600 or to an external device (or system) coupled to connector 615. Receiver 604 of processor 605 can operate to receive information from another part of system 600 or from an external device (or system) coupled to connector 615. For example, receiver 604 can receive information (e.g., data and strobe signals) from one or more of memory device 620, memory controller 630, graphics controller 640, and I/O controller 650. Receiver 604 can include components and operation of any of the receivers described above with reference to FIG. 1 through FIG. 5. For example, receiver 604 can include receiver 104 of FIG. 1 including circuit block 550 and circuit 560 of FIG. 5.

As shown in FIG. 6, memory device 620, memory controller 630, graphics controller 640, and I/O controller 650 can include transceivers 670b, 670c, 670d, and 670e, respectively, to allow each of these components to transmit and receive information through their respective transceiver. At least one of transceivers 670b, 670c, 670d, and 670e can be similar to or identical to transceiver 670a. Thus, at least one of transceivers 670b, 670c, 670d, and 670e can include a receiver similar to or identical to receiver 604 including circuit block 550 and circuit 560 of FIG. 5. For example, at least one of transceivers 670b, 670c, 670d, and 670e can include a receiver that can be arranged to allow at least one of memory device 620, memory controller 630, graphics controller 640, and I/O controller 650 to receive information (e.g., data and strobe signals) from another part of system 600 or from an external device (or system) coupled to connector 615.

FIG. 6 shows the components of system 600 arranged separately from each other as an example. For example, each of processor 605, memory device 620, memory controller 630, graphics controller 640, and I/O controller 650 can be located on a separate IC (e.g., semiconductor die or an IC chip). In some arrangements, two or more components (e.g., processor 605, memory device 620, graphics controller 640, and I/O controller 650) of system 600 can be located on the same die (e.g., same IC chip) that forms a system-on-chip (SoC).

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

Additional Notes and Examples

Example 1 includes subject matter (such as a device, an electronic apparatus (e.g., circuit, electronic system, or both), or a machine) including a first node to receive an input data signal including a first edge, and a second edge occurring after the first edge, a second node to receive a strobe signal including an edge, a first circuit to generate a modified strobe signal based on the strobe signal, the modified strobe signal including an edge occurring after the edge of the strobe signal, a second circuit to generate a modified data signal based on the input data signal, the modified data signal including an edge occurring after the second edge of the input data signal, and a third circuit to respond to the modified strobe signal and generate an output data signal based on the modified data signal.

In Example 2, the subject matter of Example 1 may optionally include, wherein the first circuit is to generate an enable signal based on the first edge of the input data signal and to delay the edge of the strobe signal for an amount of time if a time interval between the first edge of the input data signal and the edge of the strobe signal is less than the amount of time.

In Example 3, the subject matter of Example 2 may optionally include, wherein the enable signal includes a pulse, the pulse having pulse width based on the amount of time.

In Example 4, the subject matter of Example 2 may optionally include, wherein the first circuit includes a delay line, and the amount of time is based on a time delay provided by the delay line.

In Example 5, the subject matter of Example 2 may optionally include, further comprising a node to receive a signal having a first level to enable generation of the enable signal, and a second level to disable the generation of the enable signal.

In Example 6, the subject matter of Example 1 may optionally include, wherein the second circuit is to generate an enable signal based on the edge of the strobe signal and to delay the second edge of the input data signal for an amount of time if a time interval between the edge of the strobe signal and the second edge of the input data signal is less than the amount of time.

In Example 7, the subject matter of Example 6 may optionally include, wherein the enable signal includes a pulse, the pulse having a pulse width based on the amount of time.

In Example 8, the subject matter of Example 6 may optionally include, wherein the second circuit includes a delay line, and the amount of time is based on a time delay provided by the delay line.

In Example 9, the subject matter of Example 6 may optionally include, further comprising a node to receive a signal having a first level to enable generation of the enable signal, and a second level to disable the generation of the enable signal.

In Example 10, the subject matter of Example 1 may optionally include, wherein a time interval between the first edge of the input data signal and the edge of the modified strobe signal is greater than a time interval between the first edge of the input data signal and the edge of the strobe signal.

In Example 11, the subject matter of Example 1 may optionally include, wherein a time interval between the edge of the modified strobe signal and the second edge of the input data signal is greater than a time interval between the edge of the strobe signal and the second edge of the input data signal.

Example 12 includes subject matter (such as a device, an electronic apparatus (e.g., circuit, electronic system, or both), or a machine) including a first node to receive an input data signal including a first edge, and a second edge occurring after the first edge, a second node to receive a strobe signal including an edge, a first circuit to generate a modified strobe signal based on the strobe signal and a first edge of the input data signal, a second circuit to generate a modified data signal based on the input data signal and the edge of the strobe signal, and a third circuit to generate an output data signal based on the modified data signal and the modified strobe signal.

In Example 13, the subject matter of Example 12 may optionally include, wherein the first circuit includes a first driver coupled to the second node, a logic gate coupled to the first driver, and a second driver coupled to the logic gate, and the third circuit includes a clock input node coupled to an output of the second driver.

In Example 14, the subject matter of Example 13 may optionally include, wherein the second circuit includes a first additional driver coupled to the first node, an additional logic gate coupled to the first additional driver, and a second additional driver coupled to the additional logic gate, and the third circuit includes a data input node coupled to an output of the second additional driver.

In Example 15, the subject matter of Example 13 may optionally include, wherein the first circuit includes at least one transistor coupled between an output node of the logic gate and a ground connection.

In Example 16, the subject matter of Example 14 may optionally include, wherein the second circuit includes at least one transistor coupled between an output node of the additional logic gate and a ground connection.

In Example 17, the subject matter of Example 12 may optionally include, wherein the first circuit includes a delay line to receive the strobe signal from the second node.

In Example 18, the subject matter of Example 17 may optionally include, wherein the second circuit includes an additional delay line to receive the input data signal from the first node.

Example 19 includes subject matter (such as a device, an electronic apparatus (e.g., circuit, electronic system, or both), or a machine) including an antenna, and a device coupled to the antenna, the device including a receiver, the receiver including a first node to receive an input data signal including a first edge, and a second edge occurring after the first edge, a second node to receive a strobe signal including an edge, a first circuit to generate a modified strobe signal based on the strobe signal, the modified strobe signal including an edge occurring after the edge of the strobe signal, a second circuit to generate a modified data signal based on the input data signal, the modified data signal including an edge occurring after the second edge of the input data signal, and a third circuit to respond to the modified strobe signal and generate an output data signal based on the modified data signal.

In Example 20, the subject matter of Example 19 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

The subject matter of Example 1 through Example 20 may be combined in any combination.

The above description and the drawings show some embodiments to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    a first node to receive an input data signal including a first edge, and a second edge occurring after the first edge;
    a second node to receive a strobe signal including an edge;
    a first circuit to generate a modified strobe signal based on the strobe signal, the modified strobe signal including an edge occurring after the edge of the strobe signal, wherein the first circuit includes a first driver coupled to the second node, a logic gate coupled to the first driver, and a second driver coupled to the logic gate to provide the modified strobe signal;
    a second circuit to generate a modified data signal based on the input data signal, the modified data signal including an edge occurring after the second edge of the input data signal; and
    a third circuit to respond to the modified strobe signal and generate an output data signal based on the modified data signal.

2. The apparatus of claim 1, wherein the first circuit is to generate an enable signal based on the first edge of the input data signal and to delay the edge of the strobe signal for an amount of time if a time interval between the first edge of the input data signal and the edge of the strobe signal is less than the amount of time.

3. The apparatus of claim 2, wherein the enable signal includes a pulse, the pulse having pulse width based on the amount of time.

4. The apparatus of claim 2, wherein the first circuit includes a delay line, and the amount of time is based on a time delay provided by the delay line.

5. The apparatus of claim 2, further comprising a node to receive a signal having a first level to enable generation of the enable signal, and a second level to disable the generation of the enable signal.

6. The apparatus of claim 1, wherein the second circuit is to generate an enable signal based on the edge of the strobe signal and to delay the second edge of the input data signal for an amount of time if a time interval between the edge of the strobe signal and the second edge of the input data signal is less than the amount of time.

7. The apparatus of claim 6, wherein the enable signal includes a pulse, the pulse having a pulse width based on the amount of time.

8. The apparatus of claim 6, wherein the second circuit includes a delay line, and the amount of time is based on a time delay provided by the delay line.

9. The apparatus of claim 6, further comprising a node to receive a signal having a first level to enable generation of the enable signal, and a second level to disable the generation of the enable signal.

10. The apparatus of claim 1, wherein a time interval between the first edge of the input data signal and the edge of the modified strobe signal is greater than a time interval between the first edge of the input data signal and the edge of the strobe signal.

11. The apparatus of claim 1, wherein a time interval between the edge of the modified strobe signal and the second edge of the input data signal is greater than a time interval between the edge of the strobe signal and the second edge of the input data signal.

12. An apparatus comprising:
    a first node to receive an input data signal including a first edge, and a second edge occurring after the first edge;
    a second node to receive a strobe signal including an edge;
    a first circuit to generate a modified strobe signal based on the strobe signal and a first edge of the input data signal;
    a second circuit to generate a modified data signal based on the input data signal and the edge of the strobe signal; and
    a third circuit to generate an output data signal based on the modified data signal and the modified strobe signal, wherein:
    the first circuit includes a first driver coupled to the second node, a logic gate coupled to the first driver, and a second driver coupled to the logic gate; and
    the third circuit includes a clock input node coupled to an output of the second driver.

13. The apparatus of claim 12, wherein:
    the second circuit includes a first additional driver coupled to the first node, an additional logic gate coupled to the first additional driver, and a second additional driver coupled to the additional logic gate; and
    the third circuit includes a data input node coupled to an output of the second additional driver.

14. The apparatus of claim 12, wherein the first circuit includes at least one transistor coupled between an output node of the logic gate and a ground connection.

15. The apparatus of claim 13, wherein the second circuit includes at least one transistor coupled between an output node of the additional logic gate and a ground connection.

16. The apparatus of claim 12, wherein the first circuit includes a delay line to receive the strobe signal from the second node.

17. The apparatus of claim 16, wherein the second circuit includes an additional delay line to receive the input data signal from the first node.

18. An electronic system comprising:
- an antenna; and
- a device coupled to the antenna, the device including a receiver, the receiver including:
  - a first node to receive an input data signal including a first edge, and a second edge occurring after the first edge;
  - a second node to receive a strobe signal including an edge;
  - a first circuit to generate a modified strobe signal based on the strobe signal, the modified strobe signal including an edge occurring after the edge of the strobe signal, wherein the first circuit includes a first driver coupled to the second node, a logic gate coupled to the first driver, and a second driver coupled to the logic gate to provide the modified strobe signal;
  - a second circuit to generate a modified data signal based on the input data signal, the modified data signal including an edge occurring after the second edge of the input data signal; and
  - a third circuit to respond to the modified strobe signal and generate an output data signal based on the modified data signal.

19. The apparatus of claim 18, further comprising a connector coupled to the device, the connector conforming with one of Universal Serial Bus (USB), High-Definition Multimedia Interface (HDMI), Thunderbolt, Peripheral Component Interconnect Express (PCIe), and Ethernet specifications.

* * * * *